United States Patent [19]
Lattimore et al.

[11] Patent Number: 5,907,508
[45] Date of Patent: May 25, 1999

[54] METHOD AND APPARATUS FOR SINGLE CLOCKED, NON-OVERLAPPING ACCESS IN A MULTI-PORT MEMORY CELL

[75] Inventors: George McNeil Lattimore, Austin; Robert Anthony Ross, Jr., Cedar Park; Mithkal Moh'd Smadi, Round Rock, all of Tex.

[73] Assignee: International Business Machines Corporation, Armonk, N.Y.

[21] Appl. No.: 08/959,652

[22] Filed: Oct. 28, 1997

[51] Int. Cl.⁶ .................................................. G11C 7/00
[52] U.S. Cl. ................ 365/189.04; 365/154; 365/230.05
[58] Field of Search .............................. 365/189.04, 154, 365/189.01, 230.05, 233

[56] References Cited

U.S. PATENT DOCUMENTS

| | | |
|---|---|---|
| 4,366,558 | 12/1982 | Homma et al. . |
| 4,608,669 | 8/1986 | Klara et al. . |
| 4,803,663 | 2/1989 | Miyamoto et al. . |
| 4,980,860 | 12/1990 | Houston et al. . |
| 5,107,459 | 4/1992 | Chu et al. . |
| 5,144,583 | 9/1992 | Oowaki et al. . |
| 5,214,601 | 5/1993 | Hidaka et al. . |
| 5,292,678 | 3/1994 | Dhong et al. . |
| 5,459,851 | 10/1995 | Nakajima et al. . |
| 5,468,985 | 11/1995 | Harima . |
| 5,563,820 | 10/1996 | Wada et al. . |
| 5,567,963 | 10/1996 | Rao . |
| 5,581,126 | 12/1996 | Moench . |
| 5,586,072 | 12/1996 | Longway et al. . |
| 5,699,300 | 12/1997 | Akamatsu et al. ....................... 365/233 |
| 5,726,950 | 3/1998 | Okamoto et al. ....................... 365/233 |

*Primary Examiner*—Vu A. Le
*Attorney, Agent, or Firm*—Anthony V.S. England

[57] ABSTRACT

The data processing system of the present invention implements a multi-port memory cell and control therefor. In response to a single clock signal, the cell is accessed during multiple, non-concurrent intervals during a single clock cycle. Each of the accesses during the clock cycle are over a different line.

8 Claims, 6 Drawing Sheets

(a) Single Port w/ two accesses per cycle (prior art)

(b) Double Port w/ two concurrent accesses (prior art)

(c) Double Port w/ two non-concurrent accesses

METHOD AND APPARATUS FOR SINGLE CLOCKED, NON-OVERLAPPING ACCESS IN A MULTI-PORT MEMORY CELL

CROSS-REFERENCE TO RELATED, CO-PENDING APPLICATION

This application is related to the commonly assigned, co-pending patent applications filed simultaneously herewith and entitled:

"A Data Processing System and Method for Generating Memory Control Signals With Clock Skew Tolerance," by George M. Lattimore, et al., Ser. No. 08/959,653.

"A Memory System Having a Vertical Bitline Topology and Method Therefor," by George M. Lattimore, et al., Ser. No. 08/954,478; and "A Data Processing System and Method for Implementing a Multi-Port Memory Cell," by George M. Lattimore, et al., Ser. No. 08/958,559, which are hereby incorporated by reference herein.

TECHNICAL FIELD

The present invention relates in general to a data processing systems, and in particular, to memories within the data processing system.

BACKGROUND INFORMATION

As technology advances, new semiconductor memory devices have been required to store more information and to communicate that information more quickly. A dual-port memory structure is one such memory device that provides data in an efficient manner desired by current data processing systems. In a dual port memory, two polts are implemented so that the contents of the memory may be concurrently accessed from two different sources. An example of such a dual port memory is illustrated in FIG. 1.

In the dual port memory cell of FIG. 1, transistors 106, 108, 110, and 112 form a latch for storing data within the memory cell. In contrast, transistors 104, 102, 114, and 116 are pass devices that allow data to be stored within and read from the memory cell. Through the selective enabling of the "latch" transistor and the "pass" transistors, data is stored within and read from the dual-port memory cell.

In such a dual port memory cell, two pass devices can potentially be driving concurrently current to a node (such as node $N_0$). In this case, where two pass devices 114 and 116 are coupled at the node $N_0$ to the memory cell latch devices 106/108, a beta ratio between the pass devices and the NFET latch devices must be increased by a factor of two, since there will be twice as much current to the node through the two pass devices than there would be through a single pass device. This increased beta ratio is reflected in increased circuit area requirements which, in turn, increase the costs associated with manufacturing the circuit. The issue of increasing current due to increasing number of ports is described, for example, in U.S. Pat. No. 5,657,291 to Podlesny, et al., "Multi-Port Register File Memory Cell Configuration for Read Operations, at c.2, 11. 25f.

Therefore, a need exists for an apparatus and method for accessing dual port memories which reduces an amount of circuit area requirements, while maintaining the functionality typically associated with such dual port memories.

SUMMARY OF THE INVENTION

The previously mentioned needs are fulfilled with the present invention. Accordingly, there is provided, in a first form, an apparatus for storing information. The apparatus includes a memory cell having a latch accessible via first and second lines connected to the latch. Memory cell control circuitry is connected to the lines. The memory cell control circuitry is operable for controlling access to the latch in response to a single clock signal so that said access is via one of the lines at a time. The second line is restored during at least a portion of the time while the first line is being accessed.

In another aspect the control circuitry generates first and second timing signals in response to the clock signal. The clock signal has first and second states, and the timing signals have first and second states. The control circuitry limits accesses to the latch to an interval when only one of the timing signals is in the first state, regardless of at least a portion of the clock signal first and second states occurring concurrently.

In still a further aspect, the latch is accessed via the first line in response to the states of the first and second timing signals being, respectively, first and second, while the latch is accessed via the second line in response to the states of the first and second timing signals being, respectively, second and first. Moreover, one of the lines is being restored during at least a portion of the time during which the other one of the lines is being accessed.

There is also provided, in a fourth form, a method for accessing a memory cell latch, having a first and second line for accessing the latch. The method includes the steps of accessing the memory cell latch by the first line during a first interval; accessing the memory cell latch by the second line during a second interval, wherein the second interval is nonconcurrent with the first interval; and restoring the first line during the second interval; and restoring the second line during the first interval.

In another aspect, the method includes generating a first and second timing signal in response to a clock signal. The access by the first line is in response to the first timing signal, and the access by the second line is in response to the second timing signal.

In a further aspect, the method includes generating a first and second timing signal, in response to a clock signal, such timing signals having first and second states which are asserted at non-concurring time intervals, despite the clock signal first and second states occurring, at least in part, during concurrent time intervals. The latch is accessed over a first line during an interval when the first timing signal is in its first state. The latch is accessed over a second line during an interval when the second timing signal is in its first state. The first line is restored during an interval when the second timing signal is in its first state. The second line is restored during an interval when the first timing signal is in its first state, so that access cycle time is reduced in comparison with accesses to a memory cell over a single line, and latch current is reduced in comparison with concurrently accessing a memory cell over multiple lines.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the present invention, a wordline driver circuit and method of operation are designed to efficiently implement a dual-port memory cell without consuming a large amount of circuit area. In one embodiment of the present invention, a first port of a dual-port memory cell is accessed in a first of the timing cycle and a second port of the memory cell is accessed in a second of the timing cycle. In accordance with this dividing of the cycle into a first access portion and a second access portion, a first wordline may only be enabled when a second wordline is disabled, and vice versa. If this convention is utilized, a node of a latch within the memory cell never has both pass devices active and sourcing charge at the same time. Therefore, the devices in the memory cell do not have to be as large to prevent a "read disturb".

To satisfy the aforementioned convention, the present invention insures that a first wordline and a second wordline are always substantially out of phase, even when a single clock is used to enable the wordlines.

Figure 7:
FIGS. 7a, b, c, illustrates, in timing diagram form, a plurality of waveforms for a variety of ways to access a memory cell.
Figure 7:
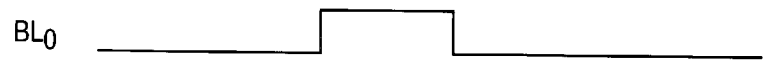
Figure 7:
Figure 7:
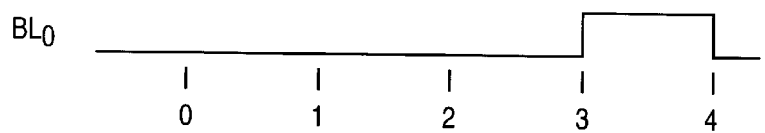
Figure 7:
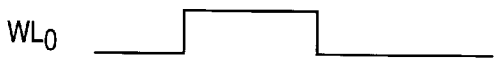
Figure 7:
Figure 7:
Figure 7:
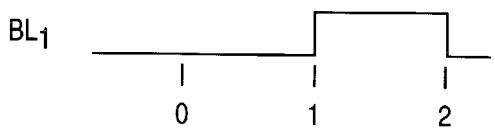
Figure 7:
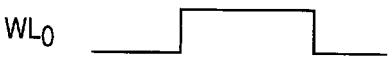
Figure 7:
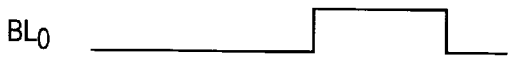
Figure 7:
Figure 7:
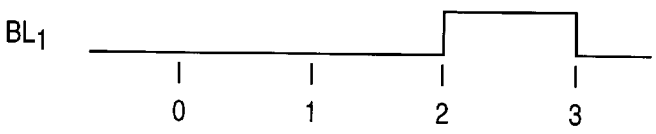

The context of the present invention may be better understood with reference to FIG. 7. The top set of wave forms illustrates a memory cell having a single wordline and bitline, $WL_0$ and $BL_0$. During a first interval, T0 to T1, a signal on the wordline is asserted so that the memory cell may be accessed over bitline $BL_0$. That is, during a second interval, T1 to T2, the bitline is restored. During a third interval, T2 to T3, a signal is again asserted on the wordline. This is shown in the third wave form of the first set in FIGURE A. It should be understood that this is another case of a signal being asserted on the wordline 0, which could be shown in the top wave form of the set. However, it is shown in a third wave form to illustrate how this is analogous to a signal being asserted on a second wordline, as is the case in the second and third sets of wave forms in FIG. 7. During a fourth time interval, T3 to T4, the bitline is again restored.

Referring now to the second set of wave forms in FIG. 7, the timing is illustrated for two concurrent accesses to a memory cell having two wordline $WL_0$ and $WL_1$ and two bitlines $BL_0$ and $BL_1$. During a first interval, time T0 to T1, a signal is asserted on wordline 0 and another signal is asserted on wordline 1 so that the memory cell is accessed concurrently over both bitlines $BL_0$ and $BL_1$. During a second interval, T1 to T2, both bit lines are restored. Obviously, the timing of these two accesses to a memory cell is much faster than the timing of the two accesses illustrated in the set of wave forms above, for the single port memory cell. That is, for the double port memory cell with two concurrent accesses, the accesses are complete by time T1. Whereas, in the single port with two accesses, the accesses are not complete until time T3. However, since in the second case, the accesses are concurrent, the NFETS in the memory cell latch for the double port memory cell must be twice the size of the NFETS for the latch of the single port memory cell.

Referring now to the third set of wave forms in FIG. 7, timing is illustrated for two non-concurrent accesses to a double port memory cell as in the present invention. During a first time interval T0 to T1, a signal is asserted on wordline 0 in order to access the memory cell overbit line 0. During interval T1 to T2, the bitline $BL_0$ is restored, while at the same time the memory cell is accessed over bitline 1 in response to the signal being asserted over wordline 1. Then, during interval T2 to T3, the bitline 1 is restored. Although not illustrated in the figure, the memory cell could be once again accessed over bitline 0 during interval T2 to T3 while bitline 1 is being restored. Thus, for the case shown in the third set of wave forms, where a memory cell is accessed over two bitlines non-concurrently, first over one bitline and then over the other bitline, the second access is complete more quickly than in the case of a single port with two successive accesses, as illustrated in the first set of wave forms in FIG. 7. But the non-concurrent accesses over two bitlines is slower than two concurrent accesses over the two bitlines, as illustrated in the second set of wave forms in FIG. 7. On the other hand, however, latch current is reduced for non-concurrent accesses in comparison with two concurrent accesses.

A following description of the present invention will describe operation of the present invention in greater detail. However, prior to this discussion, a description of connectivity of the present invention will be described in greater detail.

Description of Connectivity

In the following description, numerous specific details are set forth such as specific word or byte lengths, etc. to provide a thorough understanding of the present invention. However; it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art. Furthermore, during the description of the implementation of the present invention, the terms "assert" and "negate" and various grammatical forms thereof, are used to avoid confusion when dealing with a mixture of "active high" and "active low" logic signals. For example, in FIG. 4, the P2WL and P1WL signals are "active high," and the INTWL1 and INTWL2 signals are "active low." "Assert" is used to refer to the rendering of a logic signal or register bit into its active, or logically true, state. "Negate" is used to refer to the rendering of a logic signal or register bit into its inactive, or logically false state. Additionally, a hexadecimal value may be indicated by a "$" symbol preceding a value.

Also, it should be understood that it is well-known to accomplish a logical function in a variety of implementations, so that in one embodiment, at a given time, for example, a first signal is an active state and a second signal is an inactive state; whereas, for a complimentary embodiment at a corresponding time, the first signal is in an inactive state and the second signal is in an active state. Likewise, in one embodiment at a first given time, wherein a first signal is in an inactive state, and so on; in a second embodiment at a corresponding first time, the first signal is in an active state and at a corresponding second time the signal is in an active state. Furthermore, it should be understood that additional states are well-known, such as a third state, wherein neither a high nor low signal is asserted to a node receiving the signal, but instead a high impedance is presented to the node. Such additional states may also be used to accomplish a given logical function. Therefore, it should be understood that the functional and structural limitations in the claims which follow should not be unduly limited to the "active" and "inactive" states of the signals described in the embodiment.

A description of connectivity for each of the illustrated embodiments of the present invention will now be described. It should be noted that operation of each of these figures will subsequently be described in greater detail.

Figure 2:
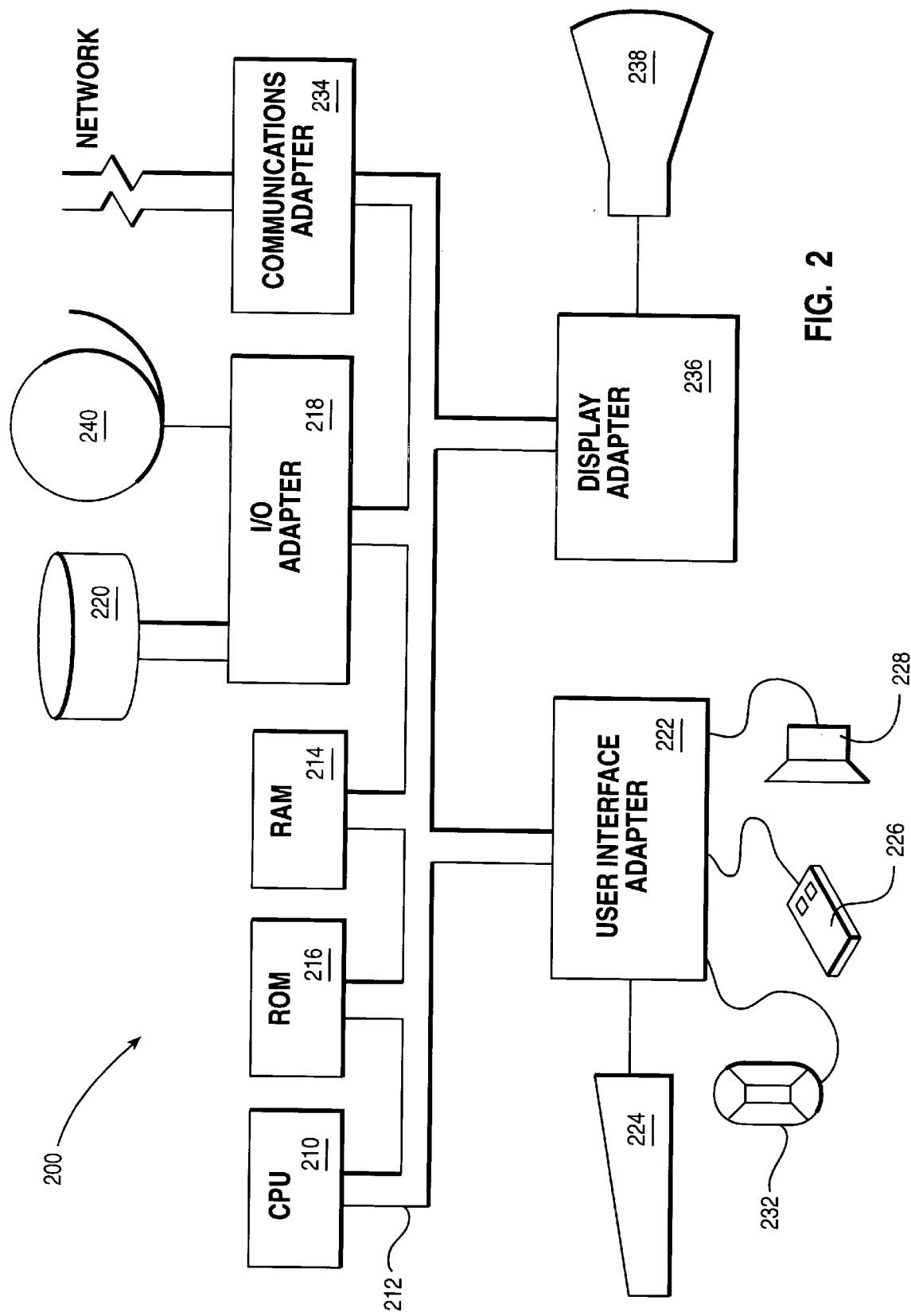
FIG. 2 illustrates, in block diagram form, a data processing system in accordance with one embodiment of the present invention.

Referring first to FIG. 2, an example is shown of a data processing system 200 which may be used for the invention. The system has a central processing unit (CPU) 210, such as a PowerPC microprocessor ("PowerPC" is a trademark of IBM Corporation) according to "The PowerPC Architecture: A Specification for a New Family of RISC Processors", 2d edition, 1994, Cathy May, et al. Ed., which is hereby incorporated herein by reference. A more specific implementation of a PowerPC microprocessor is described in the "PowerPC 604 RISC Microprocessor Users Manual", 1994, IBM Corporation, which is hereby incorporated herein by reference. The history buffer (not shown) of the present invention is included in CPU 210. The CPU 210 is coupled to various other components by system bus 212. Read only memory ("ROM") 216 is coupled to the system bus 212 and includes a basic input/output system ("BIOS") that controls certain basic functions of the data processing system 200. Random access memory ("RAM") 214, V/O adapter 218, and communications adapter 234 are also coupled to the system bus 212. I/O adapter 218 may be a small computer system interface ("SCSI") adapter that communicates with a disk storage device 220. Communications adapter 234 interconnects bus 212 with an outside network enabling the data processing system to communication with other such systems. Input/Output devices are also connected to system bus 212 via user interface adapter 222 and display adapter 236. Keyboard 224, track ball 232, mouse 226 and speaker 228 are all interconnected to bus 212 via user interface adapter 222. Display monitor 238 is connected to system bus 212 by display adapter 236. In this manner, a user is capable of inputting to the system throughout the keyboard 224, trackball 232 or mouse 226 and receiving output from the system via speaker 228 and display 238. Additionally, an operating system such as AIX ("AIX" is a trademark of the IBM Corporation) is used to coordinate the functions of the various components shown in FIG. 2.

Figure 3:
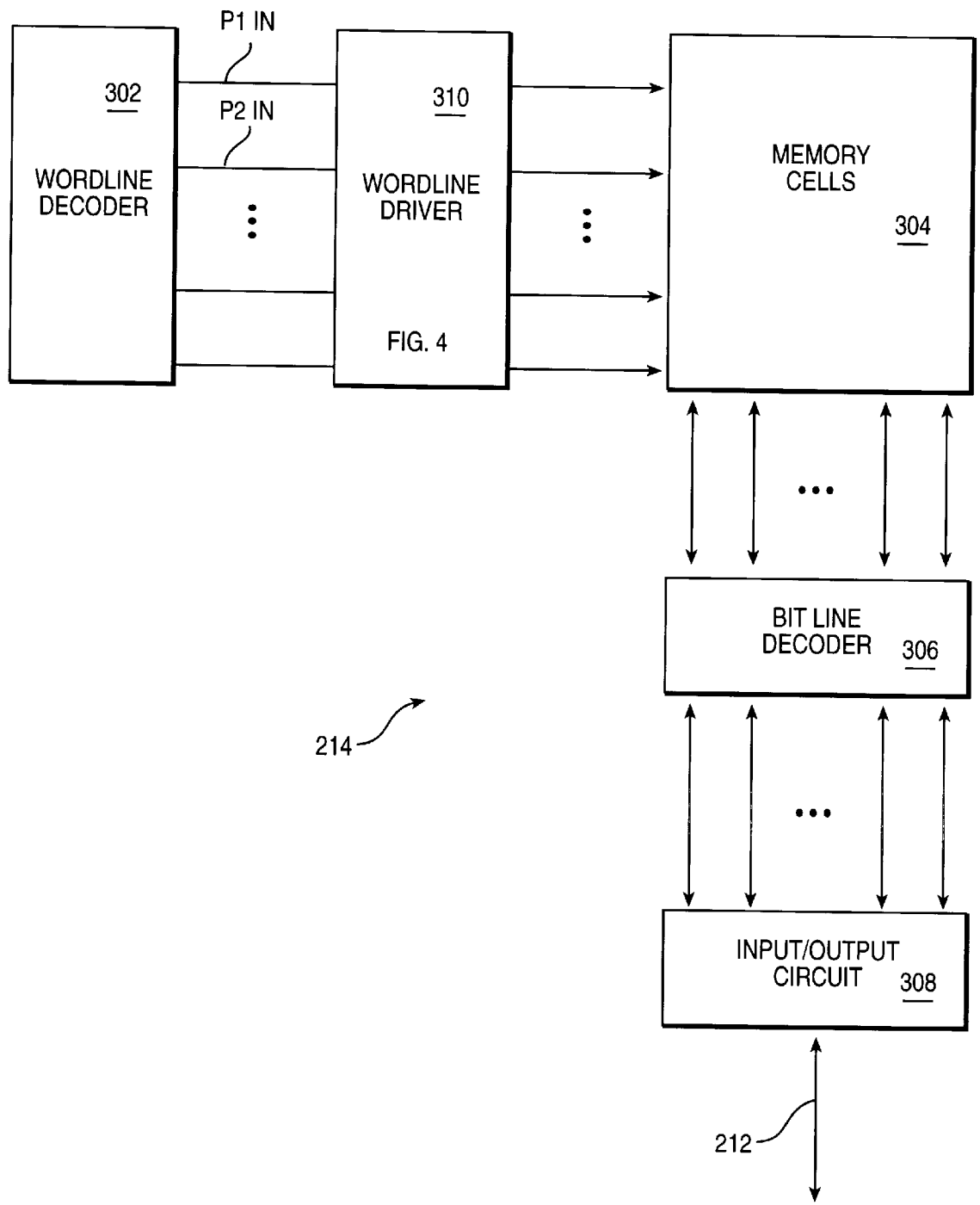
FIG. 3 illustrates, in block diagram form, a sub-array in accordance with one embodiment of the present invention.

FIG. 3 illustrates a memory 214 in greater detail. Memory 214 comprises a wordline decoder 302, a plurality of memory cell 304, a bitline decoder 306, and I/O circuit 308, and a wordline driver 310. Wordline decoder 302 is coupled to wordline driver 310 to provide a plurality of decoded data. Wordline driver 310 is coupled to the plurality of memory cells to provide the plurality of decoded data. Additionally, bitline decoder 306 is coupled to the plurality of memory cells 304 to communicate data which has been decoded or will be decoded. I/O 308 is coupled to bitline decoder 306 to communicate data with bitline decoder 306 and to determine a value which corresponds to that data.

Figure 4:
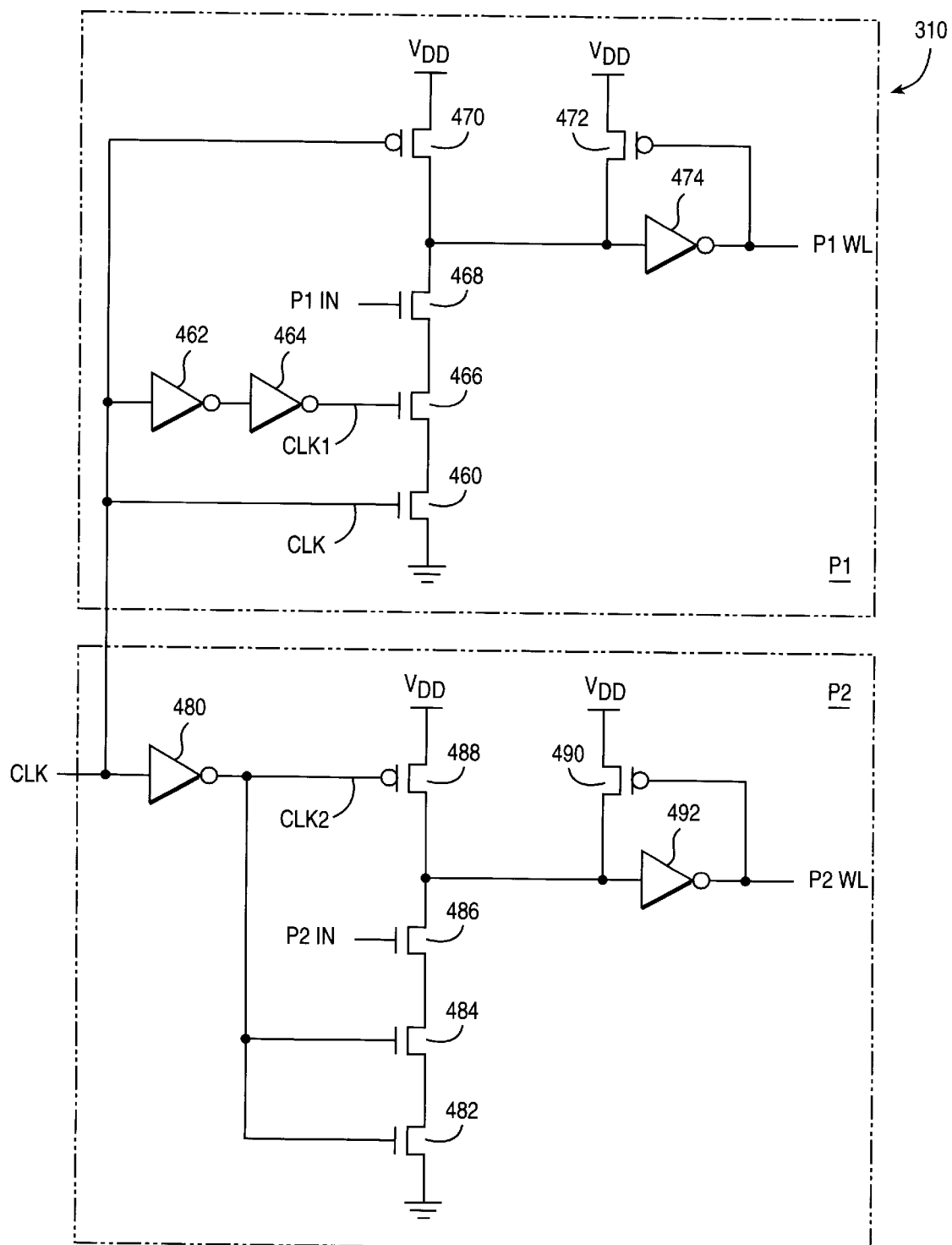
FIG. 4 illustrates a portion of a wordline driver in accordance with one embodiment of the present invention.

FIG. 4 illustrates a portion of wordline driver 310. The portion of wordline driver 310 comprises first portion, P1, for driving the Port1 wordline, and second portion, P2, for driving the Port2 wordline. In the P1 portion are four FETS having their conducting electrodes in series. The top FET in the schematic FET 470 is a PFET. The remaining three, 468, 466, and 460, are all NFETS. The NFET 460 has one conducting electrode coupled to ground. The modulating electrodes of NFET 460 and PFET 470 are connected to a line for receiving a clock signal, CLK. The modulating electrode of the NFET 468 is connected to a line for receiving enable signal, P1N. Inverters 462 and 464 are connected in series. The input to inverter to 462 is connected to the line for receiving the clock signal. And the output of inverter 464 is connected to the modulating electrode of NFET 466. The signal output from inverter 464 is referred to as timing signal CLK1. The node formed by the interconnected conducting electrodes of NFETS 468 and 470 is also connected to the input of an inverter, 474. The state of the P1WL signal output by the inverter 474 during the evaluation internal is the logical conjunction of the signals CLK, CLK1, and P1N, (although delayed by inverter 474.) Note however, that during precharge, the signal is reset to a high level in response to solely the CLK signal (and the inverter delay). The output of inverter 474 is also connected back to the modulating electrode of a PFET 472, which has one of its connecting electrodes connected to the voltage supply Vdd and the other one of its connecting electrodes connected to the input of inverter 474.

In the second portion, P2 of the wordline driver 310, there are four FETS, 482, 484, 486, and 488, having their conducting electrodes connected in series. The top FET in the schematic is PFET 488, which has one of its conducting electrodes connected to the voltage supply Vdd. The bottom FET is NFET 482 which has one of its conducting electrodes connected to ground. In the circuitry of P2, the line for receiving the CLK signal is connected to the input of an inverter 480 which has its output connected to the modulating electrodes of PFET 488 and NFETS 482 and 484. The signal out of inverter 480 is referred to as CLK2. The modulating electrode of NFET 468 is connected to a line for receiving the enable signal, P2N. The node formed by the interconnection of conducting electrodes of PFET 488 and NFET 486 is connected to the input of inverter 492. The state of the P2WL signal output by the inverter 492 during the evaluation interval is the conjunction of the signals CLK2 and P2N, (although delayed by inverter 492). Note, however, that during precharge the signal is reset to a low state in response solely to CLK2 (and the inverter delay). The output of inverter 492 is also connected to the modulating electrode of PFET 490. One of the conducting electrodes of PFET 490 is connected to the voltage supply Vdd and the other modulating electrode is connected to the input of inverter 492.

Operation of the present invention using the configurations illustrated herein and presented above will subsequently be described in greater detail.

Description of Operation

As previously mentioned, there exists a need for multi-port memory storage cells in high performance data processing systems. Such multi-port memory cells are used for read only operations, write only operations, or for both read and write operations. As is known in the data processing art, such read and write operations may occur in a same timing cycle.

Figure 1:
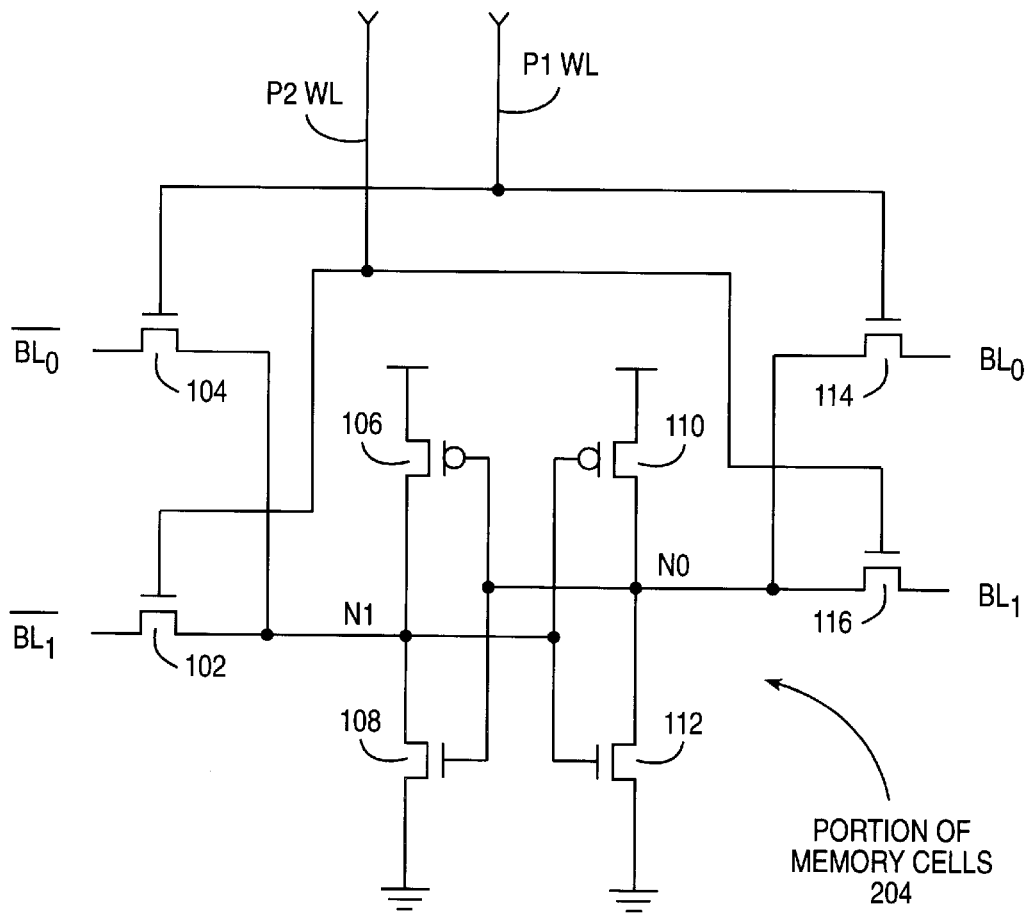
FIG. 1 illustrates, in circuit diagram form a dual-port memory cell.
Figure 6:
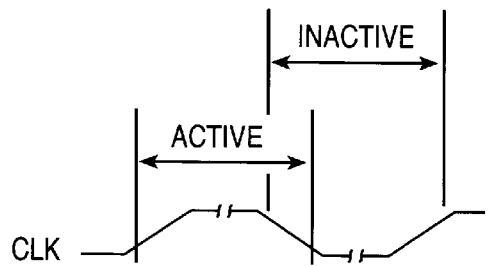
FIG. 6 illustrates, in timing diagram form, "inactive" and "active" states of a timing signal, as that terminology is used herein.

During operation of the present invention, a dual-port memory cell is accessed by driving a wordline, such as P2WL or P1WL of FIG. 1, to enable a selected one of a plurality of memory cell transfer devices. When the wordline is asserted, a pass transistor is enabled to connect a corresponding bitline to the memory cell and to then communicate the contents of the cell. It should be noted that in the dual-port memory of the present invention, each port of the cell has a corresponding pair of transfer devices. For example, transfer devices for a first port in memory cell 204 of FIG. 1 are formed by transistors 104 and 114. Similarly, transfer devices for a second port of the memory cell 204 of FIG. 1 are formed by transistors 102 and 116. It could reduce the size of the memory cell if opposite phases of a single clock could be used to control timing of accesses to the first and second ports wherein the first port is accessed in response to one clock phase and the second port is accessed in response to the opposite clock phase. However, as is illustrated in FIG. 6, a difficulty arises in precisely distinguishing between clock phases. In FIG. 6 when the clock signal is high, it is considered to be in its active phase, and when it is low is it considered to be in its inactive phase. This clock signal drives devices such as the FETS of FIG. 4. Ideally a NFET such as NFET 460, will be on when the clock is active, and will be off when the clock is inactive. However, during the transition of the clock signal from high to low, the NFET 460 will be somewhere between fully on and fully off. Thus, it may be said that during this transition region, the clock signal is in both the active and inactive states. That is, a part of the active phase occurs concurrently with a part of the inactive phase. Consequently, if Port1 of a memory cell were accessed during the active phase of the clock signal shown in FIG. 6 and Port2 were accessed during the inactive phase, there could be an overlap between the two accesses.

To ensure that such overlap does not occur, the present embodiment provides non-overlapping wordline signals, for a first and second wordline, in response to a single clock signal, so that one wordline is not enabled before the other wordline is disabled. Specific operation of the present invention will now be discussed in greater detail.

FIG. 2 illustrates data processing system 200 which implements one embodiment of the present invention. A memory, which utilizes the wordline drivers of the present invention is typically implemented within RAM device 214. It should be noted that RAM device 214 may be implemented as any type of dual-port memory known to those with skill in the relevant art, including SRAM memories.

Assume that RAM 214 has a configuration such as that illustrated in FIG. 3 in one embodiment of the present invention. In a portion of RAM 214 illustrated in FIG. 3, a wordline decoder decodes data provided by another portion of data processing system 200 to access one of the plurality of memory cells 304. The decoded data values are provided from wordline decoder 302 to wordline driver 310. Wordline driver 310 provides a plurality of wordlines to a corresponding one of the plurality of memory cells 304, and ensures that a first wordline and a second wordline are not simultaneously provided to the same memory cell. Additionally, input/output circuit 308 receives address information from bus 212, which are subsequently provided to bitline decoder 306. Bitline decoder 306 decodes the address values and provides the decoded values as bitline values to each of the plurality of memory cells 304.

While a system level description of operation of RAM 214 has been provided, a more detailed description of wordline driver 310 will be subsequently discussed. Wordline driver 310 is illustrated in greater detail in FIG. 4. In FIG. 4, a signal labeled P2IN is provided by wordline decoder 302 to enable wordline driver 310 to provide a Port Two Wordline (P2WL) signal to a selected portion of the plurality of memory cells 304. Additionally, in FIG. 4, a Port One Input (P1IN) signal is provided by wordline decoder 302 to wordline driver 310. Within wordline driver 310, the P1IN signal generates a port one wordline (P1WL) signal.

In one embodiment of the present invention, the logic circuitry of FIG. 4 is implemented as dynamic circuitry. Therefore, during an interval when the CLK and CLK1 signals are asserted, the P1WL signal will also be asserted if port one has been selected—that is, if the P1IN signal is asserted. Similarly, during a portion of a timing interval when the CLK2 signal is asserted, the P2WL signal will also be enabled if port two has been selected—that is, if the P2IN signal is asserted.

Figure 5:
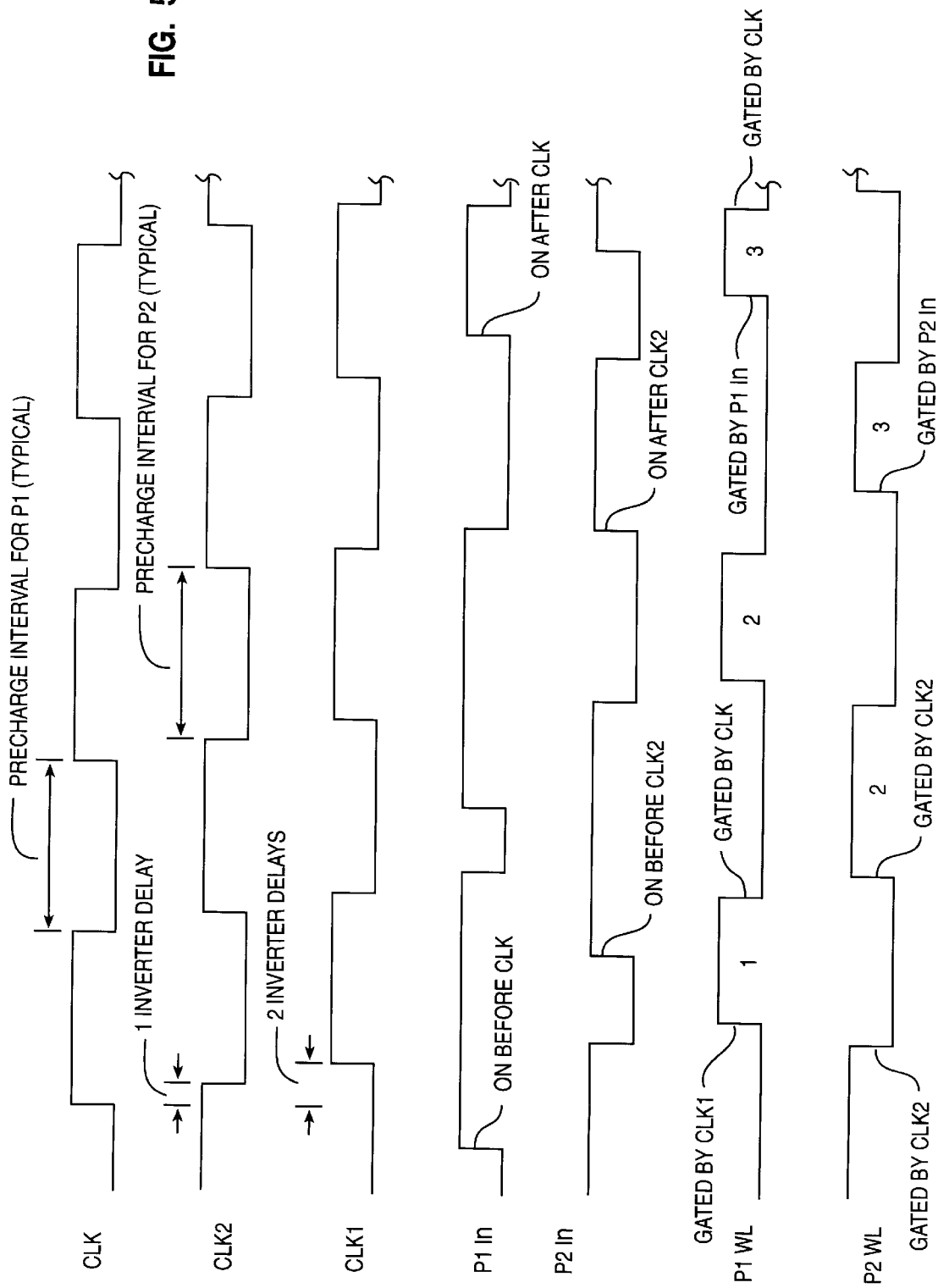
FIG. 5 illustrates, in timing diagram form, a timing relationship between a plurality of inputs to the portion of the wordline driver of FIG. 4.

As previously mentioned, the present invention ensures the P2WL signal and the P1WL signal do not overlap when asserted (i.e., are not simultaneously asserted). How that is accomplished may be better understood with reference to FIG. 5, along with FIG. 4. (FIG. 5 shows idealized timing signals. However, the reader should understand that the signals do not instantaneously transition from the active to inactive state.) Signal CLK is input to inverter 462, whose output is input to inverter 464. The resulting inverter 464 output signal, CLK1, is thus delayed by the delay inherent in two such inverters. The CLK2 signal is only one inverter delay behind the CLK signal, since CLK2 is the output of inverter 480, which gets its input from the CLK signal.

Nonconcurrent accesses to the memory latch is achieved as follows, in response to a signal clock signal CLK. One access is in response to the signal on P1 word line, P1WL. Regardless of whether the P1 word line is selected, i.e., regardless of whether the P1IN signal is asserted, during the precharge (or "restore") interval, which is typical for dynamic logic, the signal output by inverter 474 on P1WL goes low in response to the CLK signal going low. The P1WL signal falling edge is delayed, with respect to the CLK signal falling edge, by the delays in i) the PFET 470 pulling up the precharge node for the P1 circuitry, i.e., the node at the connection of the drain electrodes of PFET 470 and NFET 468, and ii) the inverter 474 responding to the voltage being pulled up on the precharge node. At the end of the precharge interval, the CLK signal rises. Then if the P1 word line is selected, the signal on P1WL goes high in response to the CLK1 signal going high and pulling down the precharge node. The P1WL signal rising edge is delayed with respect to the CLK1 signal rising edge, by the time delay in NFET 466 pulling down the precharge node and the inverter 474 responding.

The above described timing is illustrated in the first two instances of P1WL being asserted shown in FIG. 5. The third instance illustrates a case where the P1WL rising edge is gated by the wordline select signal on P1IN. In this instance, the signal on P1IN is not asserted until after CLK1 is asserted, so the precharge node is not pulled down in response to FET 466 turning on, but rather in response to turning on FET 468 by the P1IN signal.

A second access is in response to the signal on the P2 word line, P2WL. Regardless of whether the P2 word line is selected, i.e., regardless of whether the P2In signal is asserted, during the precharge interval the signal output by inverter 492 on P2WL goes low in response to the CLK2 signal going low. The P2WL signal falling edge is delayed, with respect to the CLK2 signal falling edge, by the delays in i) the PFET 488 pulling up the p/recharge node for the P2 circuitry, and ii) the inverter 492 responding to the voltage being pulled up on the precharge node. At the end of the precharge interval, the CLK2 signal rises. Then, if the P2 word line is selected, the signal on P2WL goes high in response to the CLK2 signal going high and pulling down the precharge node. The P2WL signal rising edge is delayed, with respect to the CLK2 signal rising edge, by the time delay in pulling down the precharge node through NFETs 484 and 482 and in the inverter 492 responding.

The above described timing is illustrated in the first two instances of P2WL being asserted shown in FIG. 5. The third instance illustrates a case where the P2WL rising edge is gated by the wordline select signal on P2IN. In this instance, the signal on P2IN is not asserted until after CLK2 goes high, so the precharge node for circuitry P2 is not pulled down in response to FETs 484 and 482 turning on, but rather in response to turning on FET 486 by the P2IN signal.

A net result of the above is that P1WL is not asserted until at least one device switching delay after P2WL is negated. Likewise, P2WL is not asserted until at least one device switching time after P1WL is negated. Therefore, as long as slew rates do not exceed the one device switching time delay, P1WL and P2WL signals will not overlap. If more separation of the P1WL and P2WL signals is needed due to unfavorable slew rates, an even number of inverters can be added to the delay chains which generate CLK1 and CLK2 in response to CLK.

While there have been described herein the principles of the invention, it is to be clearly understood to those skilled in the art that this description is made by way of example only and not as a limited to the scope of the invention. Accordingly, it is intended, by the appended claims, to cover all modifications of the invention which fall within the true spirit and scope of the invention.

What is claimed is:

1. An apparatus for storing information, comprising:
    a memory cell, having a latch accessible via first and second lines coupled to the latch; and
    memory cell control circuitry coupled to the lines, operable for controlling access to the latch in response to a single clock signal such that said access is via one of the lines at a time, and wherein the other one of the lines is being restored during at least a portion of that time.

2. The apparatus of claim 1, wherein the clock signal has first and second states, and wherein the control circuitry generates first and second timing signals in response to the clock signal, the timing signals having first and second states, and limits the access to an interval when only one of the timing signals is in its first state, regardless of at least a portion of the clock signal first and second states occurring concurrently.

3. The apparatus of claim 2, wherein said access via one of the lines at a time includes accessing the latch via the first line in response to the states of the first and second timing signals being, respectively, first and second, and accessing the latch via the second line in response to the states of the first and second timing signals being, respectively, second and first.

4. An apparatus for storing information, comprising:
    a memory cell, having a latch accessible via first and second lines coupled to the latch; and
    memory cell control circuitry coupled to the lines, operable for controlling access to the latch in response to first and second timing signals, the timing signals being generated in response to a clock signal having first and second states, so that said access is via only one of the lines at a time, wherein the first and second timing signals have first and second states, and wherein the controlling limits the access to an interval when only one of the timing signals is in its first state, regardless of at least a portion of the first and second states of the clock signal occurring concurrently.

5. The apparatus of claim 4, wherein said access via one of the lines at a time includes accessing the latch via the first line in response to the states of the first and second timing signals being, respectively, first and second, and accessing the latch via the second line in response to the states of the first and second timing signals being, respectively, second and first.

6. The apparatus of claim 4, wherein one of the lines is being restored during at least a portion of the time during which the other one of the lines is being accessed.

7. A method for accessing a memory cell latch, the latch having a first and second line for accessing the latch, comprising the steps of:
    accessing the memory cell latch by the first line during a first interval;
    accessing the memory cell latch by the second line during a second interval, wherein the second interval is non-concurrent with the first interval;
    restoring the first line during the second interval; and restoring the second line during the first interval; and
    generating a first and second timing signal in response to a clock signal, wherein the access by the first line is in response to the first timing signal, and the access by the second line is in response to the second timing signal.

8. A method for accessing a memory cell latch, comprising the steps of:
    generating a first and second timing signal, in response to a clock signal, such timing signals having first and second states which are asserted at non-concurring time intervals, despite the clock signal first and second states occurring, at least in part, during concurrent time intervals;
    accessing the latch over a first line during an interval when the first timing signal is in its first state;
    accessing the latch over a second line during an interval when the second timing signal is in its first state;
    restoring the first line during an interval when the second timing signal is in its first state; and
    restoring the second line during an interval when the first timing signal is in its first state, so that access cycle time is reduced in comparison with accesses to a memory cell over a single line, and latch current is reduced in comparison with concurrently accessing a memory cell over multiple lines.

* * * * *